United States Patent
Uemura et al.

(10) Patent No.: US 9,295,949 B2
(45) Date of Patent: *Mar. 29, 2016

(54) VENTILATION MEMBER

(71) Applicant: Nitto Denko Corporation, Ibaraki-shi, Osaka (JP)

(72) Inventors: Kou Uemura, Osaka (JP); Youzou Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 41 days.

This patent is subject to a terminal disclaimer.

(21) Appl. No.: 14/226,335

(22) Filed: Mar. 26, 2014

(65) Prior Publication Data

US 2014/0290490 A1 Oct. 2, 2014

(30) Foreign Application Priority Data

Mar. 26, 2013 (JP) ................................ 2013-064210

(51) Int. Cl.
*B01D 53/22* (2006.01)
*B01D 69/02* (2006.01)
(Continued)

(52) U.S. Cl.
CPC ............... *B01D 69/02* (2013.01); *F21S 48/337* (2013.01); *F21V 31/03* (2013.01); *H02K 5/10* (2013.01); *H05K 5/0213* (2013.01); *H02K 2205/09* (2013.01)

(58) Field of Classification Search
CPC .......... B01D 69/02; F21V 31/03; H02K 5/10; H02K 5/0213; H02K 2205/09; F21S 48/337
See application file for complete search history.

(56) References Cited

U.S. PATENT DOCUMENTS 3,109,623 A * 11/1963 Bryant ........................... 251/172
3,320,097 A * 5/1967 Sugalski ......................... 429/55
(Continued)

FOREIGN PATENT DOCUMENTS

EP 0 710 795 5/1996
EP 0 831 572 3/1998
(Continued)

OTHER PUBLICATIONS

Prospector "Compression Set—ASTM D395 Plastic Test Standard" http://www2.ulprospector.com/property_descriptions/ASTMD395.asp Jun. 15, 2015, 1 page.*

(Continued)

*Primary Examiner* — Jason M Greene
*Assistant Examiner* — Anthony Shumate
(74) *Attorney, Agent, or Firm* — Hamre, Schumann, Mueller & Larson, P.C.

(57) ABSTRACT

The present invention provides a ventilation member attachable to a housing having an opening for ventilation. This ventilation member includes: a support including: a base portion adapted to form an air passage between an interior space and an exterior space of the housing; and a leg portion extending from the base portion and adapted to be fitted into the opening; an air-permeable membrane disposed on the support to cover the air passage; and a sealing member made of a resin and placed at a root of the leg portion of the support. This sealing member has a compression set of 10% or less when measured under conditions of a test temperature of 100° C. and a test time of 100 hours in accordance with JIS K 6262. According to the present invention, it is possible to provide a ventilation member suitable for preventing water from entering a housing even during a high-pressure car wash test using high-temperature water.

6 Claims, 3 Drawing Sheets

(51) Int. Cl.
*F21V 31/03* (2006.01)
*H02K 5/10* (2006.01)
*H05K 5/02* (2006.01)
*F21S 8/10* (2006.01)

(56) References Cited

U.S. PATENT DOCUMENTS

| | | | | |
|---|---|---|---|---|
| 3,909,302 | A * | 9/1975 | Mermelstein | H01M 2/367 429/86 |
| 5,209,992 | A * | 5/1993 | Feres | H01M 2/1205 429/86 |
| 5,759,469 | A * | 6/1998 | Asanuma et al. | 264/235 |
| 6,994,621 | B2 * | 2/2006 | Mashiko | F21V 31/03 362/345 |
| 7,166,024 | B2 * | 1/2007 | Mashiko | F21S 48/335 454/270 |
| 7,169,849 | B2 * | 1/2007 | Ikuji et al. | 525/88 |
| 7,579,096 | B2 * | 8/2009 | Osada et al. | 429/404 |
| 7,582,352 | B2 * | 9/2009 | Kobayashi et al. | 428/319.3 |
| 7,771,890 | B2 * | 8/2010 | Osada et al. | 429/515 |
| 7,781,494 | B2 * | 8/2010 | Okada et al. | 522/112 |
| 8,038,832 | B2 * | 10/2011 | Tanaka | 156/325 |
| 8,246,726 | B2 * | 8/2012 | Yano | B60R 16/0239 123/41.86 |
| 8,814,993 | B2 * | 8/2014 | Yano | 96/4 |
| 8,821,226 | B2 * | 9/2014 | Yano | B65D 77/225 454/143 |
| 8,828,125 | B2 * | 9/2014 | Furuuchi et al. | 96/4 |
| 9,052,119 | B2 | 6/2015 | Uemura et al. | |
| 2002/0155275 | A1 * | 10/2002 | Kobayashi et al. | 428/318.8 |
| 2003/0216119 | A1 * | 11/2003 | Mashiko | F21S 48/335 454/275 |
| 2003/0220067 | A1 * | 11/2003 | Mashiko | F21V 31/03 454/143 |
| 2004/0162380 | A1 * | 8/2004 | Kojima et al. | 524/462 |
| 2006/0201944 | A1 * | 9/2006 | Shibasaka et al. | 220/254.1 |
| 2008/0249246 | A1 * | 10/2008 | Okada et al. | 525/221 |
| 2009/0025870 | A1 * | 1/2009 | Tanaka | 156/273.3 |
| 2009/0047890 | A1 * | 2/2009 | Yano | B65D 77/225 454/143 |
| 2010/0227543 | A1 * | 9/2010 | Furuyama | B29C 65/1635 454/270 |
| 2011/0016836 | A1 * | 1/2011 | Yano | B60R 16/0239 55/491 |
| 2013/0012117 | A1 * | 1/2013 | Uemura et al. | 454/275 |
| 2014/0041520 | A1 * | 2/2014 | Daimon et al. | 96/4 |
| 2014/0047981 | A1 * | 2/2014 | Uemura et al. | 96/4 |
| 2014/0137739 | A1 * | 5/2014 | Ishii et al. | 96/11 |
| 2014/0227960 | A1 * | 8/2014 | Ishii et al. | 454/275 |
| 2014/0290488 | A1 * | 10/2014 | Uemura et al. | 96/4 |
| 2014/0290489 | A1 * | 10/2014 | Uemura et al. | 96/4 |
| 2014/0318374 | A1 * | 10/2014 | Yano | 96/11 |
| 2015/0050877 | A1 * | 2/2015 | Yano et al. | 454/338 |

FOREIGN PATENT DOCUMENTS

| | | |
|---|---|---|
| EP | 1 939 523 | 7/2008 |
| EP | 1 997 685 | 12/2008 |
| JP | 2004-047425 | 2/2004 |

OTHER PUBLICATIONS

NOK "O-Ring-Technical_Information" http://www.nok.com.sg/o-ring.aspx#o-ring Mar. 16, 2009, 61-71 pages.*

* cited by examiner

VENTILATION MEMBER

BACKGROUND OF THE INVENTION

1. Field of the Invention

The present invention relates to ventilation members.

2. Description of Related Art

Conventionally, in automotive electrical/electronic components such as automotive lamps and ECUs (electronic control units), OA (office automation) equipment, household electrical appliances, medical equipment, etc., openings are formed in housings containing electronic components, control boards, etc. to reduce pressure fluctuations due to temperature changes in the housings or to ventilate the interior of the housings, and ventilation members are attached to the openings. These ventilation members not only ensure ventilation between the interior and exterior of the housings but also prevent foreign substances such as dust and water from entering the housings. JP 2004-047425 A discloses an example of such a ventilation member. FIG. 4 shows a ventilation member disclosed in JP 2004-047425 A.

A ventilation member 110 includes a support 104, an air-permeable membrane 102 disposed on the support 104, a cover member 106 covering the air-permeable membrane 102, and a sealing member 108 mounted in a gap between the support 104 and a housing 120. The ventilation member 110 is fixed to an opening 121 of the housing 120 via the sealing member 108. Leg portions 112 of the support 104 are engaged with the opening 121 to prevent detachment of the ventilation member 110 from the housing 120. The sealing member 108 is a resin O-ring mounted around the opening 121 and in the gap between the support 104 and the housing 120.

SUMMARY OF THE INVENTION

Many automotive components and materials are required to pass environmental tests specified by various industrial standards such as JIS (Japanese Industrial Standards). Examples of the environmental tests include a temperature cycle test and a high-pressure car wash test. Ventilation members are also required to provide performance high enough to withstand these temperature cycle test and high-pressure car wash test.

These days, cars are sometimes washed with high-temperature and high-pressure water to remove stubborn stains. However, if a car provided with a conventional ventilation member attached to a housing is washed with high-temperature and high-pressure water, the water may enter the housing through a gap between the ventilation member and the housing.

In view of these circumstances, it is an object of the present invention to provide a ventilation member suitable for preventing water from entering a housing even during a car wash with high-temperature and high-pressure water.

The present invention provides a ventilation member attachable to a housing having an opening for ventilation. This ventilation member includes: a support including: a base portion adapted to form an air passage between an interior space and an exterior space of the housing; and a leg portion extending from the base portion and adapted to be fitted into the opening; an air-permeable membrane disposed on the support to cover the air passage; and a sealing member made of a resin and placed at a root of the leg portion. This sealing member has a compression set of 10% or less when measured under conditions of a test temperature of 100° C. and a test time of 100 hours in accordance with JIS K 6262.

According to the present invention, the sealing member having a compression set of 10% or less is used. Therefore, the sealing member is less susceptible to deformation even during a high-pressure car wash test using high-temperature water, and thus prevents water from entering the housing.

DETAILED DESCRIPTION OF THE INVENTION

Hereinafter, embodiments of the present invention are described with reference to the accompanying drawings. The following description relates to the embodiments of the present invention, and the present invention is not limited to these embodiments.

Figure 1:
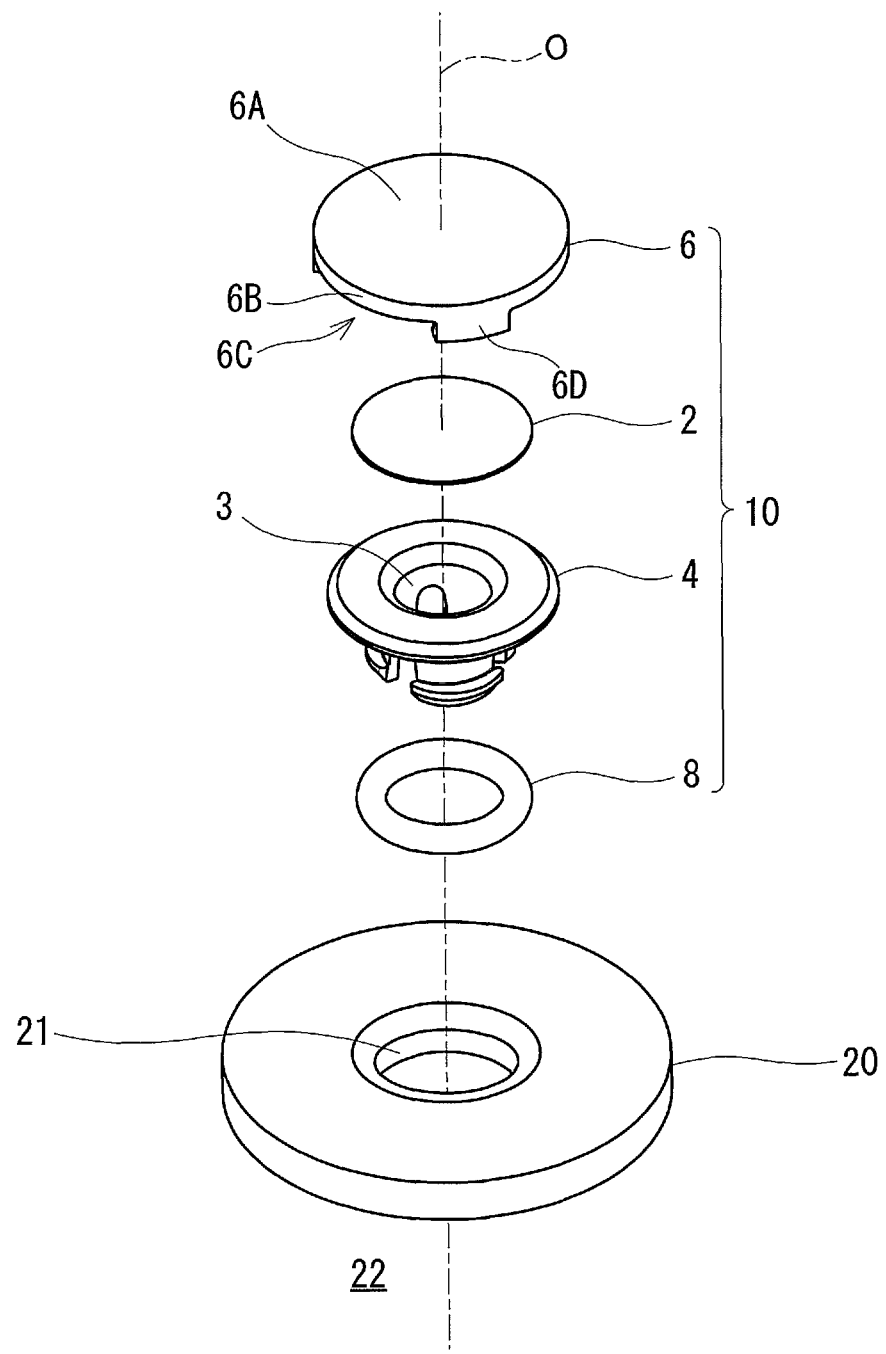
FIG. 1 is an exploded perspective view of a ventilation member according to an embodiment of the present invention.
Figure 2:
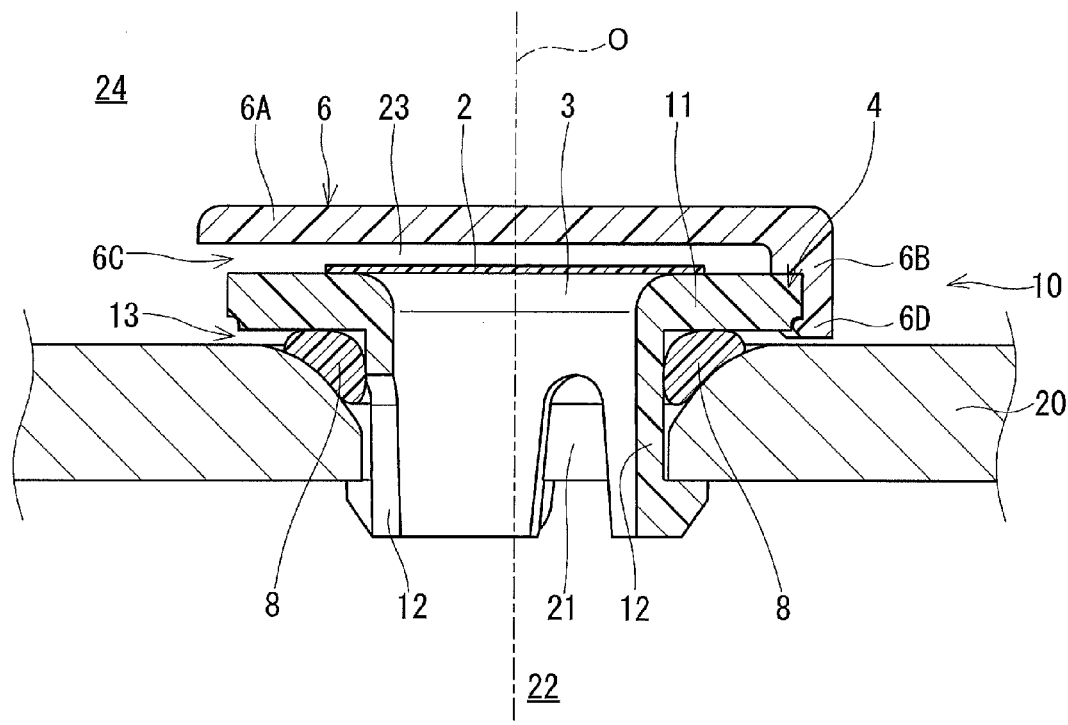
FIG. 2 is a cross-sectional view of the ventilation member shown in FIG. 1.

As shown in FIG. 1 and FIG. 2, a ventilation member 10 according to the present embodiment is adapted to be attached to an opening 21 of a housing 20. As shown in FIG. 2, the opening 21 is a through hole communicating an interior space 22 and an exterior space 24 of the housing 20. The ventilation member 10 includes an air-permeable membrane 2, a support 4, a cover member 6, and a sealing member 8. The air-permeable membrane 2, the support 4, and the cover member 6 each have a circular outline in plan view. The air-permeable membrane 2, the support 4, and the cover member 6 have a common central axis O. The thickness direction of the air-permeable membrane 2 is parallel to the central axis O. The support 4 has a vent hole 3 that is a through hole serving as an air passage between the interior space 22 and the exterior space 24. The air-permeable membrane 2 is disposed on the support 4 so as to cover one end of the vent hole 3 that opens into the exterior space 24. Air can flow between the interior space 22 and the exterior space 24 through the air-permeable membrane 2. The housing 20 is, for example, an automotive ECU (electronic control unit) box, and FIG. 1 and FIG. 2 show only a part of the housing 20.

As shown in FIG. 2, the support 4 has a base portion 11 and a plurality of leg portions 12. The base portion 11 supports the air permeable membrane 2. The leg portions 12 are adapted to fix the ventilation member 10 to the opening 21 of the housing 20. The leg portions 12 extend from the base portion 11 toward the interior space 22 of the housing 20.

As shown in FIG. 1 and FIG. 2, the cover member 6 is attached to the support 4 so as to cover the air-permeable membrane 2. The cover member 6 includes a ceiling portion 6A covering the entire surface of the air-permeable membrane 2 in plan view, a protective wall portion 6B extending from the outer edge of the ceiling portion 6A toward the support 4, and three apertures 6C formed in the protective wall portion 6B. As shown in FIG. 2, a ventilation space 23 is formed between the ceiling portion 6A of the cover member 6 and the air-permeable membrane 2 and between the ceiling portion 6A of the cover member 6 and the periphery of the support 4. The ventilation space 23 communicates with the exterior space 24 through the apertures 6C of the cover member 6. The ventilation space 23 serves as a part of an air passage between the interior space 22 and the exterior space 24. The cover member 6 further has three locking portions 6D extending from the peripheral edge of the protective wall portion 6B toward the support 4 so as to be elastically engaged with the support 4. The three apertures 6C are arranged between the locking portions 6D. The locking portions 6D are provided at regular intervals (at regular angular intervals), and the apertures 6C are provided at regular intervals (at regular angular intervals).

As shown in FIG. 1 and FIG. 2, the sealing member 8 is an elastic member for sealing the gap between the support 4 and the housing 20 when the ventilation member 10 is attached to the housing 20. The sealing member 8 is an O-ring adapted to be mounted around the opening 21 and in a gap 13 between the support 4 and the housing 20. The sealing member 8 is a resin member having a compression set of 10% or less when measured under the conditions of a test temperature of 100° C. and a test time of 100 hours in accordance with JIS K 6262. The compression set refers to a residual strain produced in a specimen when the specimen is compressed at a specified ratio between compression plates and maintained at a specified temperature for a specified time in accordance with JIS K 6262. The sealing member 8 is made of, for example, EPDM (ethylene propylene diene monomer rubber), silicone rubber, or fluorine rubber.

Figure 4:
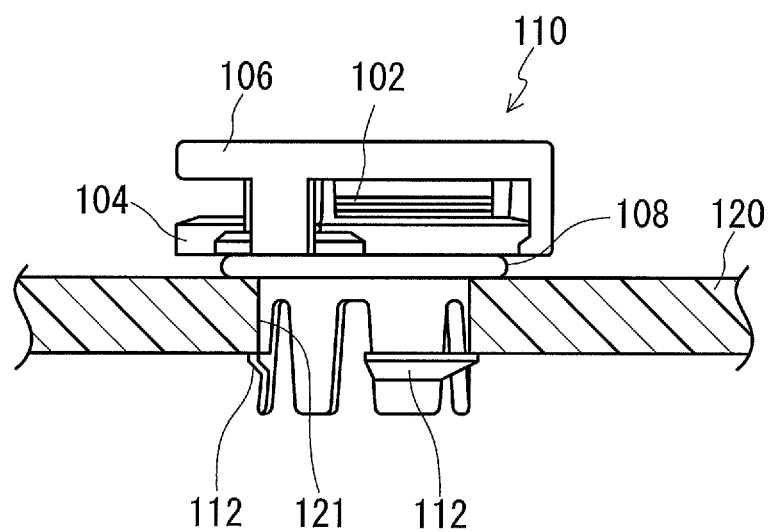
FIG. 4 is a cross-sectional view of a conventional ventilation member.

When the leg portions 12 of the support 4 are inserted into the opening 21 of the housing 20, the support 4 is pushed back in the direction in which it is removed from the housing 20 by the elastic force of the sealing member 8 interposed between the support 4 and the housing 20. When the support 4 is pushed back, the hooks of the leg portions 12 are engaged with the housing 20 in the interior space 22 of the housing 20 so as to prevent detachment of the ventilation member 10 from the housing 20. The portion corresponding to the sealing member 8 may be formed integrally with the support 4 by a technique such as two-color molding or insert molding. The sealing member 8 may be bonded to the support 4. As shown in FIG. 2, the opening 21 of the housing 20 has a tapered portion whose diameter increases from the interior space 22 toward the exterior space 24. The tapered portion is formed at the end of the opening 21 that opens into the exterior space 24, and the surface of the tapered portion is in contact with the sealing member 8. This ventilation structure is suitable for preventing entry of water during high-pressure car washing. However, the ventilation member of the present invention can also be fitted for use in an untapered straight opening of a housing (see FIG. 4).

Figure 3:
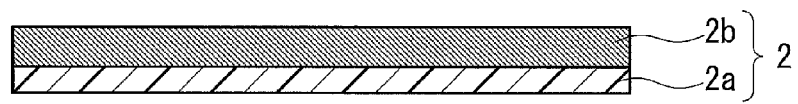
FIG. 3 is a cross-sectional view of an air-permeable membrane shown in FIG. 1.

Next, the air-permeable membrane 2 is described. The structure and material of the air-permeable membrane 2 are not particularly limited and any membrane can be used as long as it has the properties of allowing gases to pass therethrough and preventing liquids from passing therethrough. As shown in FIG. 3, the air-permeable membrane 2 may have a membrane body 2a and a reinforcing material 2b laminated on the membrane body 2a. The strength of the air-permeable membrane 2 is increased by the reinforcing material 2b added thereto. It should be understood that the air-permeable membrane 2 may consist of the membrane body 2a.

The membrane body 2a may be subjected to an oil-repellent treatment or a water-repellent treatment. This liquid-repellent treatment can be performed by applying a substance having a low surface tension to the membrane body 2a, followed by drying and then curing. Any liquid-repellent agent can be used for the liquid-repellent treatment as long as a coating film having a lower surface tension than that of the membrane body 2a can be formed using the agent. For example, a liquid-repellent agent containing a polymer having a perfluoroalkyl group can be suitably used. The liquid-repellent agent is applied to the membrane body 2a by a known technique such as impregnation or spraying.

A typical example of the membrane body 2a is a porous membrane made of a fluorine resin or a polyolefin. In terms of ensuring sufficient waterproofness, a porous resin membrane having an average pore diameter of 0.01 to 10 μm can be used as the membrane body 2a.

Examples of the fluorine resin suitable for use as the membrane body 2a include polytetrafluoroethylene (PTFE), polychlorotrifluoroethylene, tetrafluoroethylene-hexafluoropropylene copolymer, and tetrafluoroethylene-ethylene copolymer. Examples of the polyolefin suitable for use as the membrane body 2a include polymers and copolymers of monomers such as ethylene, propylene, and 4-methylpentene-1,1 butene. Porous nanofiber film materials containing polyacrylonitrile, nylon, or polylactic acid may also be used. In particular, PTFE is preferred because it has not only high air permeability per unit area but also high ability to prevent foreign substances from entering the housing. Porous PTFE membranes can be produced by known molding techniques such as stretching and extraction.

The reinforcing material 2b can be a member made of a resin such as polyester, polyethylene, or aramid. The form of the reinforcing material 2b is not particularly limited as long as the air permeability of the air-permeable membrane 2 can be maintained. For example, the reinforcing member 2b is a woven fabric, a nonwoven fabric, a net, a mesh, a sponge, a foam, or a porous material. The membrane body 2a and the reinforcing member 2b may be laminated together by heat lamination, heat welding, or ultrasonic welding, or with an adhesive.

The thickness of the air-permeable membrane 2 is preferably in the range of 1 μm to 5 mm, in view of the strength and the ease of handling. The air permeability of the air-permeable membrane 2 is preferably in the range of 0.1 to 300 sec/100 cm$^3$ in terms of Gurley Number obtained by the Gurley test method specified in JIS P 8117. The water entry pressure of the air-permeable membrane 2 is preferably 1.0 kPa or more.

Next, a method for producing the ventilation member 10 is described. First, the support 4 and the cover member 6 are produced separately. The support 4 and the cover member 6 each can be produced by a known injection molding technique. The material that can be used for the support 4 and the cover member 6 is typically a thermoplastic resin. Examples of the thermoplastic resin include polybutylene terephthalate, nylon, and polyethylene terephthalate.

The housing 20 also can be produced by a known injection molding technique. As shown in FIG. 1 and FIG. 2, one end of the opening 21 that opens into the exterior space 24 has a larger diameter than the other end of the opening 21 that opens into the interior space 22. Therefore, it is easy to insert the leg portions 12 into the opening 21. In addition, this shape of the opening 21 can increase, to some extent, the cross-sectional area of the air passage from the vent hole 3 to the interior space 22. Furthermore, since the diameter of the opening 21 is smaller on the interior space 22 side, the leg portions 12 are set so as to be inclined with respect to the central axis O. This is preferable in securely engaging the hooks of the leg portions 12 with the opening 21 to increase the attachment strength of the ventilation member 10 to the housing 20.

Hereinafter, the present invention will be described in more detail by way of Examples, but the present invention is not limited to the following Examples.

First, the evaluation method for sealing members of Examples and the methods of a high pressure water resistance test and an acid resistance test for ventilation members are shown below.

[Hardness]

The hardness (Hs) of each sealing member was evaluated using a durometer in accordance with JIS K 6253-3:2012 (Vulcanized Rubber and Thermoplastic Rubber—Test Method for Hardness—Chapter 3: Durometer Hardness).

[Tensile Strength]

The tensile strength (MPa) of each sealing member was evaluated in accordance with JIS K 6251:2010 (Vulcanized Rubber and Thermoplastic Rubber—Test Method for Tensile Properties).

[Elongation at Break]

The elongation at break (%) of each sealing member was evaluated in accordance with JIS K 6251:2010.

[Tensile Stress]

The tensile stress (MPa) of each sealing member was evaluated in accordance with JIS K 6251:2010.

[Compression Set]

The compression set (%) of each sealing member was evaluated under conditions of a test temperature of 100° C. and a test time of 100 hours in accordance with JIS K 6262:2006 (Vulcanized Rubber and Thermoplastic Rubber—Test Method for Compression Sets at Normal Temperature, High Temperature, and Low Temperature).

[High Pressure Water Resistance Test Method]

The high pressure water resistance test of each ventilation member attached to a housing was performed under the conditions of a water temperature of 25° C. and 80° C. in accordance with DIN (Deutsche Industrie Normen) 40050 IPX9K. The ventilation member in which water entry into the housing was observed was classified as "unacceptable (x)", and the ventilation member in which water entry into the housing was not observed was classified as "acceptable (○)".

[Acid Resistance Test Method]

The acid resistance test of each ventilation member attached to a housing was performed by dropping a 37% aqueous sulfuric acid solution over the entire ventilation member. The ventilation member was allowed to stand for 48 hours at test temperatures (25° C., 80° C., 115° C., and 125° C., respectively). After the ventilation member was removed from the housing, the sealing pressure (kPa) of the sealing member was measured. The ventilation member in which the sealing pressure of the sealing member was 500 kPa or more was classified as "acceptable (○)" in the acid resistance test, and the ventilation member in which the sealing pressure of the sealing member was less than 500 kPa was classified as "unacceptable (x)" in the acid resistance test.

Example 1

The properties of an O-ring (manufactured by NOK Corporation) serving as a sealing member made of EPDM (ethylene propylene diene monomer rubber) were measured according to the above-mentioned evaluation methods for the sealing members. Table 1 shows the results. The compression set of the sealing member of Example 1 was 5%.

TABLE 1

|  | Hardness (Hs) | Tensile strength (MPa) | Elongation at break (%) | Tensile stress (MPa) | Compression set (%) |
| --- | --- | --- | --- | --- | --- |
| Example 1 | 72 | 20.9 | 22.0 | 5.5 | 5 |
| Example 2 | 72 | 5.6 | 150 | 4.1 | 9 |
| Com. Example | 73 | 15.6 | 300 | 3.1 | 15 |

A ventilation member, which is the same as a commercially available Z-PLUG (manufactured by Nitto Denko Corporation, see FIG. 1 and FIG. 2) except that the O-ring serving as a sealing member was replaced with the above-mentioned O-ring (manufactured by NOK Corporation), was prepared. This ventilation member was attached to the opening of the housing, and was subjected to a high-pressure water resistance test according to the high-pressure water resistance test method described above. Table 2 shows the results. In Example 1, water entry into the housing was not observed when the water temperatures were 25° C. and 80° C. in the high-pressure water resistance test.

TABLE 2

|  | High-pressure water resistance test | |
| --- | --- | --- |
|  | 25° C. | 80° C. |
| Example 1 | ○ | ○ |
| Example 2 | ○ | ○ |
| Com. Example | ○ | x |

This ventilation member was attached to the opening of the housing and subjected to an acid resistance test according to the acid resistance test method described above. Table 3 shows the results. In Example 1, the ventilation member was classified as acceptable when the test temperatures were 25° C., 80° C., 115° C., and 125° C. in the acid resistance test.

TABLE 3

|  | Acid resistance test | | | |
| --- | --- | --- | --- | --- |
|  | 25° C. | 80° C. | 115° C. | 125° C. |
| Example 1 | ○ | ○ | ○ | ○ |
| Example 2 | ○ | x | x | x |
| Com. Example | ○ | ○ | ○ | ○ |

Example 2

The tests were performed in the same manner as in Example 1 using the same ventilation member, except that an O-ring (manufactured by Kyowa Seal Co., Ltd.) was used as a sealing member made of silicone resin. Tables 1 to 3 show the results. The compression set of the sealing member of Example 2 was 9%. In Example 2, water entry into the housing was not observed when the water temperatures were 25° C. and 80° C. in the high-pressure water resistance test. In Example 2, the ventilation member was classified as acceptable when the test temperature was 25° C. in the acid resistance test. However, the ventilation member was classified as unacceptable when the test temperatures were 80° C., 115° C., and 125° C. in the acid resistance test.

Comparative Example

The tests were performed in the same manner as in Example 1 using the same ventilation member, except that an O-ring (manufactured by Kyowa Seal Co., Ltd.) was used as a sealing member made of EPDM. Tables 1 to 3 show the results. The compression set of the sealing member of Comparative Example was 15%. In Comparative Example, water entry into the housing was not observed when the water temperature was 25° C. in the high-pressure water resistance test. However, water entry into the housing was observed when the water temperature was 80° C. in the high-pressure water resistance test. In Comparative Example, the ventilation member was classified as acceptable when the test temperatures were 25° C., 80° C., 115° C., and 125° C. in the acid resistance test.

As shown in Table 1, the compression sets of the sealing members of Examples 1 and 2 were 10% or less. As shown in Table 2, in the ventilation members of Examples 1 and 2, water entry into the housings was not observed when the water temperature was 80° C. in the high-pressure water resistance test. These results confirmed that the ventilation members of Examples 1 and 2 were effective in preventing water from entering the housings even during a car wash with high-temperature and high-pressure water.

As shown in Table 3, the ventilation members of Example 1 and Comparative Example were classified as acceptable when the test temperature was 80° C. or higher in the acid resistance test, but the ventilation member of Example 2 was classified as unacceptable when the test temperature was 80° C. or higher in the acid resistance test. This is presumably because the sealing member of Example 2 was made of silicone resin while the sealing members of Example 1 and Comparative Example were made of EPDM. These results confirm that the ventilation member of Example 1 is resistant to acids at high temperatures and is effective in preventing water from entering the housing even during a car wash with high-temperature and high-pressure water.

The ventilation member of the present invention can be used for housings for automotive components such as lamps, motors, sensors, switches, ECUs, and gear boxes. The ventilation member of the present invention can be used not only for automotive components but also for electric appliances such as mobile communication devices, cameras, electric shavers, and electric toothbrushes.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A ventilation structure comprising:
   a housing having an opening for ventilation; and
   a ventilation member attached to the opening, the ventilation member comprising:
      a support comprising: a base portion adapted to form an air passage between an interior space and an exterior space of the housing; and a leg portion extending from the base portion and adapted to be fitted into the opening;
      an air-permeable membrane disposed on the support to cover the air passage; and
      a sealing member made of a resin and placed at a root of the leg portion, the sealing member having a compression set of 10% or less when measured under conditions of a test temperature of 100° C. and a test time of 100 hours in accordance with JIS K 6262;
      wherein the opening has a tapered portion, a diameter of the opening increasing from the interior space toward the exterior space at the tapered portion; and
      the sealing member is in contact with the housing only at the tapered portion and in contact with the base portion and the leg portion of the support.

2. The ventilation structure according to claim 1, wherein the sealing member is an O-ring adapted to be mounted around the opening and between the support and the housing.

3. The ventilation structure according to claim 1, wherein the sealing member is made of EPDM (ethylene propylene diene monomer rubber).

4. The ventilation structure according to claim 1, wherein the sealing member is made of silicone resin.

5. The ventilation structure according to claim 1, further comprising a cover member provided over the air-permeable membrane to cover the support.

6. The ventilation structure according to claim 5, wherein the cover member comprises: a ceiling portion covering an entire surface of the air-permeable membrane in plan view; a protective wall portion extending from an outer edge of the ceiling portion toward the support; and an aperture formed in the protective wall portion and adapted to communicate the exterior space with a space between the ceiling portion and the support.

* * * * *